(12) United States Patent
Park et al.

(10) Patent No.: US 8,555,810 B2
(45) Date of Patent: Oct. 15, 2013

(54) PLASMA DRY ETCHING APPARATUS HAVING COUPLING RING WITH COOLING AND HEATING UNITS

(75) Inventors: Min-Joon Park, Yongin-si (KR); Su-Hong Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 567 days.

(21) Appl. No.: 12/792,915

(22) Filed: Jun. 3, 2010

(65) Prior Publication Data

US 2010/0326600 A1 Dec. 30, 2010

(30) Foreign Application Priority Data

Jun. 25, 2009 (KR) .................. 10-2009-0057172

(51) Int. Cl.
*H01L 21/3065* (2006.01)
(52) U.S. Cl.
USPC .................. 118/723 E; 118/724; 156/345.52; 156/345.53; 156/345.37
(58) Field of Classification Search
USPC ................... 118/723 I, 723 IR, 723 AN, 724; 156/345.48, 345.49, 345.52, 345.53, 156/345.37; 315/111.51
See application file for complete search history.

(56) References Cited

U.S. PATENT DOCUMENTS

| | | | |
|---|---|---|---|
| 6,024,826 A * | 2/2000 | Collins et al. ............ | 156/345.37 |
| 6,171,438 B1 * | 1/2001 | Masuda et al. ........... | 156/345.27 |
| 6,363,882 B1 * | 4/2002 | Hao et al. ................. | 118/723 E |
| 6,444,084 B1 * | 9/2002 | Collins ...................... | 156/345.1 |
| 6,723,202 B2 * | 4/2004 | Nagaiwa et al. ......... | 156/345.43 |
| 7,244,336 B2 * | 7/2007 | Fischer et al. ........... | 156/345.51 |
| 7,470,627 B2 * | 12/2008 | Han et al. ................. | 438/710 |
| 7,678,225 B2 * | 3/2010 | Nezu et al. ............... | 156/345.47 |
| 7,882,800 B2 * | 2/2011 | Koshiishi et al. ........ | 118/723 R |
| 2004/0040933 A1 * | 3/2004 | Kanno et al. ............. | 216/67 |
| 2010/0326600 A1 * | 12/2010 | Park et al. ................ | 156/345.37 |

FOREIGN PATENT DOCUMENTS

| | | |
|---|---|---|
| EP | 1 154 466 A1 | 11/2001 |
| JP | 2002-164323 A | 6/2002 |
| KR | 10-2001-0101716 A | 11/2001 |
| KR | 10-2002-0041732 A | 6/2002 |
| KR | 10-2008-0046822 A | 5/2008 |

OTHER PUBLICATIONS

Machine Generated English Translaition of KR 10-2008-0046822 held to Kim Ki Chul published May 28, 2008.*

* cited by examiner

*Primary Examiner* — Sylvia R MacArthur
(74) *Attorney, Agent, or Firm* — Lee & Morse, P.C.

(57) ABSTRACT

A plasma dry etching apparatus includes a pedestal in a process chamber, the pedestal being configured to support a wafer, a cathode electrode and a plate electrode in the process chamber, the cathode and plate electrodes being configured to apply radio-frequency (RF) power, an edge ring on an edge of the pedestal, a coupling ring having a first side on the pedestal and a second side on the edge ring, an edge cooling unit in the coupling ring, the edge cooling unit being configured to cool the edge ring to drop a temperature of an extreme edge of the wafer, and an edge heating unit in the coupling ring, the edge heating unit being configured to heat the edge ring to raise the temperature of an extreme edge of the wafer.

19 Claims, 8 Drawing Sheets

|  | POLY ETCHING | OXIDE ETCHING |
|---|---|---|
| PROPERTY OF PLASMA REACTION | RADICAL ETCHING | POLYMERIC ETCHING |
| PRODUCT OF PLASMA REACTION | RADICAL ETCHANT | POLYMER |
| ETCH RATE RELATIVE TO PLASMA REACTION | INCREASE | REDUCTION |
| CRITICAL DIMENSION RELATIVE TO PLASMA REACTION | REDUCTION | INCREASE |
| MEASURES TO BE TAKEN | COOLING | HEATING |

PLASMA DRY ETCHING APPARATUS HAVING COUPLING RING WITH COOLING AND HEATING UNITS

BACKGROUND

1. Field

Example embodiments relate to a plasma dry etching apparatus capable of controlling a temperature of an extreme edge of a wafer during a plasma etching process. More particularly, example embodiments relate to a plasma dry etching apparatus including an edge ring with cooling and heating units capable of controlling the surface temperature of an extreme edge of a wafer.

2. Description of Related Art

In general, fabrication of semiconductor devices may involve a process of etching a material layer formed on a wafer using a predetermined etching apparatus, e.g., a process of forming a contact hole through an insulating layer. Etching apparatuses may be classified into dry etching apparatuses and wet etching apparatuses according to the type of an etching process.

For example, a wet etching apparatus is capable of processing a plurality of wafers at the same time. However, some problems, e.g., formation of an undercut, may occur due to isotropic etching characteristics of the wet etching apparatus. For instance, the wet etching apparatus may be inappropriate for an etching process for forming a contact hole.

In comparison, a dry etching apparatus is capable of etching a material layer using plasma, and exhibits anisotropic etching characteristics. Thus, the dry etching apparatus may be widely applied to, e.g., a process of forming line-and-space patterns or contact holes. Dry etching apparatuses may be categorized into physical dry etching apparatuses or chemical dry etching apparatuses.

In a physical dry etching apparatus, ions generated in plasma may be accelerated due to an electrical field to collide with a material layer. Thus, although the physical dry etching apparatus may have good anisotropic etching characteristics, the physical dry etching apparatus may have a poor etch selectivity with respect to a layer disposed under the material layer. In contrast, in the chemical dry etching apparatus, a material layer may be etched due to a chemical reaction of the material layer with radicals generated in plasma. Thus, although the chemical dry etching apparatus may have good selective etching characteristics, the chemical dry etching apparatus may also have isotropic etching characteristics.

In recent years, ion-enhanced plasma etching processes having both good selective etching characteristics and anisotropic etching characteristics have been employed by combining only advantages of the physical and chemical dry etching apparatuses. However, it is still difficult to overcome nonuniform critical linewidth of bars or "not-open" etching failures during formation of line-and-space patterns or contact holes.

SUMMARY

Embodiments are therefore directed to a plasma dry etching apparatus, which substantially overcomes one or more of the problems due to the limitations and disadvantages of the related art.

It is therefore a feature of an embodiment to provide a plasma dry etching apparatus including edge cooling and heating units disposed at an edge ring, thereby facilitating temperature control of an extreme edge of a wafer and its utilization as a product.

It is another feature of an embodiment to provide a plasma dry etching apparatus capable of actively controlling a surface temperature of a wafer.

It is yet another feature of an embodiment to provide a plasma dry etching apparatus capable of independently controlling a temperature of a pedestal supporting a wafer and a temperature of an edge ring at a predetermined distance from the wafer.

It is still another feature of an embodiment to provide a plasma dry etching apparatus capable of selectively controlling an etching process according to a process gas when an etch rate is increased due to a poly etching process using radicals and when an etch rate is reduced due to an oxide etching process using a polymer.

At least one of the above and other features and advantages may be realized by providing a plasma dry etching apparatus, including a process chamber in which an etching process is performed, a pedestal included in the process chamber, and on which a wafer is loaded, a cathode electrode and a plate electrode disposed in the process chamber and configured to apply radio-frequency (RF) power, an edge ring disposed on an edge of the pedestal, a coupling ring having a first side supported by the pedestal and a second side connected to the edge ring, an edge cooling unit in the coupling ring, the edge cooling unit being configured to cool the edge ring and an extreme edge of the wafer, and an edge heating unit in the coupling ring, the edge heating unit being configured to heat the edge ring and the extreme edge of the wafer.

The process chamber may be a dry etching apparatus configured to apply the RF power to an etch gas to generate a plasma gas, and form a pattern on a polysilicon (poly-Si) layer or oxide layer formed on the wafer using the plasma gas. The edge cooling unit may cool the coupling ring and drop the temperature of the edge ring disposed adjacent to the coupling ring when a CD of a pattern is reduced during a poly etching process. Also, the edge heating unit may heat the coupling ring and raise the temperature of the adjacent edge ring when the CD of the pattern is increased during an oxide etching process. The edge ring and the coupling ring may be discrete elements, each of the edge ring and coupling ring being positioned to overlap an extreme edge of the wafer.

The edge ring may be formed of a ceramic material that is generally applicable to both a poly etching process and an oxide etching process. The coupling ring may be formed of a thermal conductive metal.

The plasma dry etching apparatus may further include a back-side cooling unit and a back-side heating unit configured to cool or heat a lower portion of the pedestal and cool or heat a back side of the wafer to control the temperatures of a center and periphery of the wafer loaded on the pedestal. The edge cooling and heating units may control the temperature of the extreme edge of the wafer independently of the back-side cooling and heating units. To do this, a thermal insulation layer configured to cut off heat transmission may be further disposed between the pedestal and the coupling ring. The thermal insulation layer may be formed of one selected from the group consisting of $Al_2O_3$, ceramic, quartz, or engineering plastic to a thickness of about 0.1 mm to about 10 mm.

The edge cooling unit may include a coolant channel configured to be turned at least once along the inside of the coupling ring with the ring structure, a coolant configured to flow through the coolant channel, and a supply channel and a discharge channel configured to extend downward from both sides of the coolant channel from which the coolant starts to flow to supply or discharge the coolant.

The coupling ring may be cast using aluminum (Al). An annular groove having an opening may be formed in a bottom surface of the coupling ring during the casting of the coupling ring, and the opening of the groove may be sealed using a brazing or welding process so that the coolant channel can be formed to a height of about 2 mm to about 20 mm and a width of about 2 mm to about 20 mm.

The edge ring and the coupling ring may be bonded to each other by an epoxy polymer pad or a silicon polymer pad, which has a thickness of about 0.05 mm to about 5 mm. The pedestal may be coupled to the coupling ring using a bolt. In order to secure a mounting space of the bolt, the coolant channel may circulate within the coupling ring and be turned in a zigzag curve. A first O-ring for sealing off the coolant from a vacuum space may be disposed on edges of the supply and discharge channels between the coupling ring and the pedestal. The first O-ring may be closely adhered to the coupling ring and the pedestal by the bolt.

The plasma dry etching apparatus may further include an insulator plate disposed under the pedestal, an insulator ring disposed along an outer circumference of the pedestal, and a cover ring disposed on the insulator ring. The supply channel and the discharge channel may further extend toward the insulator plate or the insulator ring. A second O-ring may be further disposed between the pedestal and the insulator plate or between the pedestal and the insulator ring.

The edge heating unit may include a heater coil and a heater terminal. The heater coil may be disposed a predetermined distance apart from the coolant channel over and parallel to the coolant channel and turned at least once. The heater terminal may be disposed in a space between the supply channel and the discharge channel where the coolant channel is not provided. The heater terminal may extend vertically to the heater coil within such a range as not to overlap the supply channel and the discharge channel.

The heater may be a resistive heater with a power of about 50 W to about 500 W. Also, the heater may be a cast-in heater that is cast with the hater coil inserted thereto integrally with the coupling ring.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0057172, filed on Jun. 25, 2009, in the Korean Intellectual Property Office, and entitled: "Plasma Dry Etching Apparatus Having Coupling Ring with Cooling and Heating Units," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer or element is referred to as being "on" another element or substrate, it can be directly on the other element or substrate, or intervening elements may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

Figure 1:
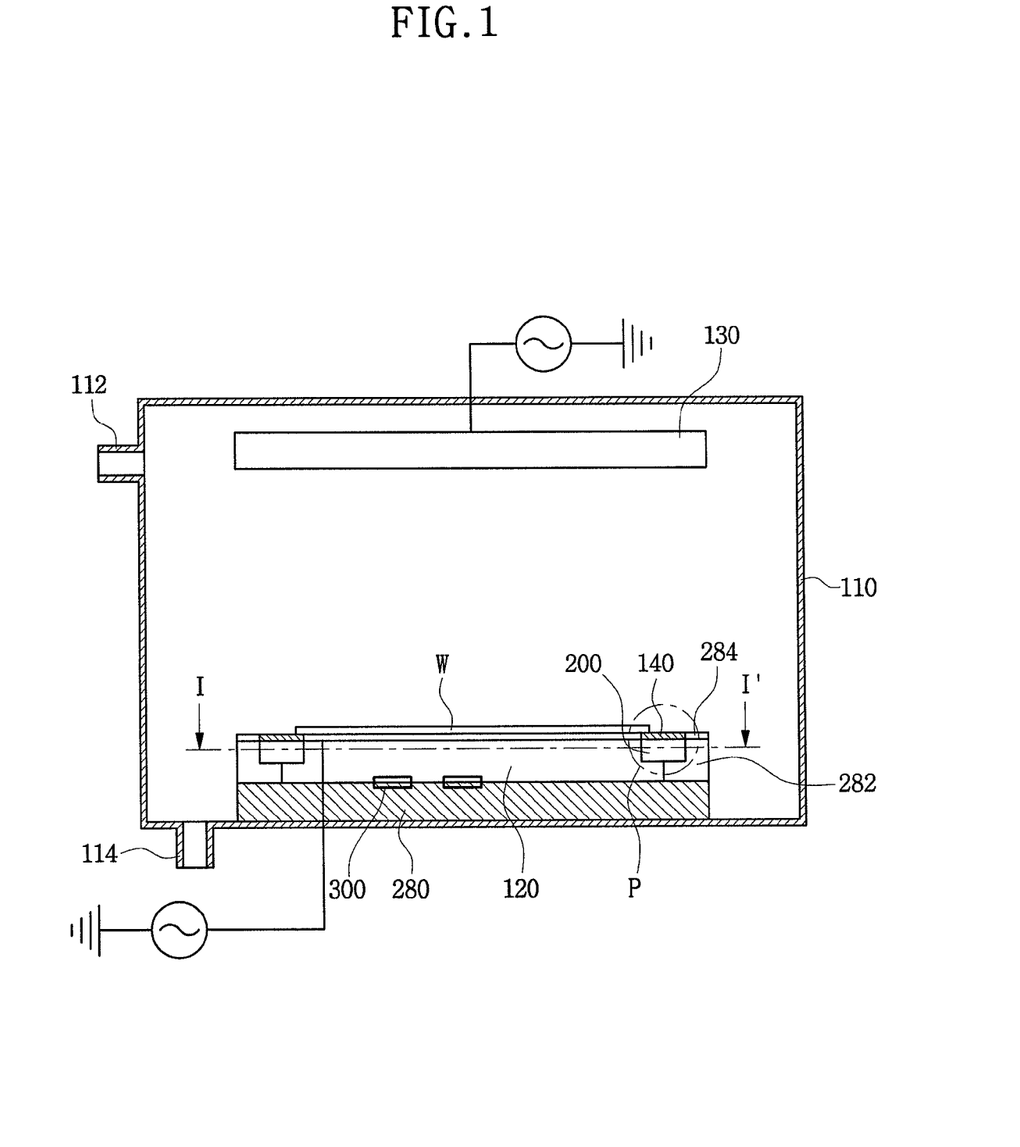
FIG. 1 illustrates a schematic cross-sectional view of a plasma dry etching apparatus according to example embodiments.

Referring to FIG. 1, a dry etching apparatus according to example embodiments may include a process chamber 110 in which an etching process is performed, a pedestal 120 provided within the process chamber 110 to load a wafer W thereon, a cathode electrode 130 in an upper portion of the process chamber 110, e.g., above the pedestal 120, and a plate electrode installed in a lower portion of the process chamber 110 facing the cathode electrode 130, e.g., in the pedestal 120, to apply radio-frequency (RF) power to the process chamber 110. The dry etching apparatus may further include a coupling ring 200 with an edge cooling and/or heating units, as will be described in more detail below with reference to FIGS. 5-8.

Although not specifically limited, the process chamber 110 may have a roughly cylindrical shape and an anodic-oxidized aluminum (Al) surface. An air inlet 112 may be installed on one side, e.g., of a lateral surface, of the process chamber 110 to supply a process gas required for a plasma reaction. An air outlet 114 may be installed on one side, e.g., of a bottom surface, of the process chamber 110 to reduce an internal pressure of the process chamber 110 to a predetermined pressure. Although the process chamber 110 is divided into an upper chamber and a lower chamber, the process chamber 110 will now be described for brevity without the division of the process chamber 110 into the upper and lower chambers.

The cathode electrode 130 may be spaced a predetermined distance apart from the plate electrode, over the plate electrode, and parallel to the plate electrode. The cathode electrode 130 may have a shower head structure to uniformly distribute the process gas within the process chamber 110.

Since the plate electrode may be provided in or under the pedestal 120 (see power supply in FIG. 1 connected to the pedestal 120), the plate electrode is not denoted by a separate reference numeral. In other words, the pedestal 120 may function both to support the wafer W and to apply RF power as a plate electrode.

The pedestal 120 may include a fixing chuck, which may fix the wafer W onto the pedestal 120. The fixing chuck may be an electrostatic chuck (ESC), which may fix the wafer W using dielectric polarization and electrostatic principles, but the present example embodiments are not limited thereto. For example, the fixing chuck according to the example embodiments may be a vacuum chuck or any other fixing chuck, which may fix the wafer W using mechanical properties. However, since the process chamber 110 is in a vacuum state, e.g., no pressure difference between vacuum states may be generated, the ESC may be more efficient for a fine fixing operation than the vacuum chuck. Thus, although the ESC or the vacuum chuck is actually provided on the pedestal 120, it is assumed for brevity that the pedestal 120 includes the ESC or the vacuum chuck.

Figure 7:
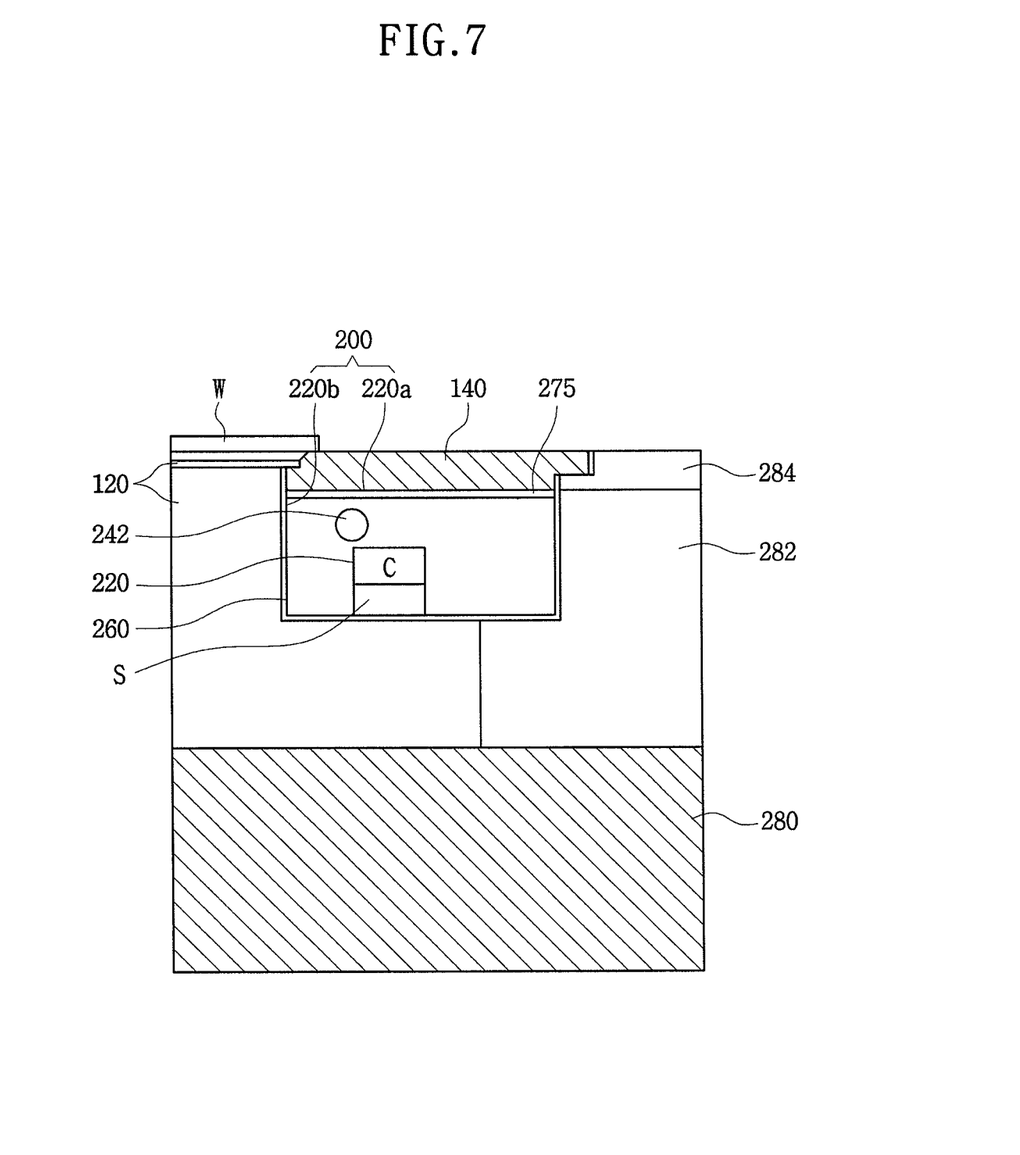
FIG. 7 illustrates a cross-sectional view taken along line B-B of FIG. 5, in which a portion P of FIG. 1 is enlarged.

An edge ring 140 may be installed on an edge of the pedestal 120 to surround the wafer W. For example, as illustrated in FIGS. 1 and 7, the edge ring 140 may be a separate element from the pedestal 120, and may be attached to and around a terminal edge of the pedestal 120. The edge ring 140 may be installed on the side of the wafer W to allow a top surface of the wafer W to be exposed to plasma. For example, the edge ring 140 may be attached to the pedestal 120, such that upper surfaces of the edge ring 140 and the pedestal 120 may be substantially coplanar, and the wafer W may be positioned on the pedestal 120 and the edge ring 140, e.g., an extreme edge of the wafer W may be on, e.g., directly on, the edge ring 140. The edge ring 140 may function to focus or confirm plasma. The edge ring 140 may be formed of, e.g., quartz, silicon, or a ceramic material.

A back-side cooling and/or heating unit 300 may be further provided under the pedestal 120 in order to maintain the loaded wafer W, i.e., center and periphery of the wafer W, at a substantially constant temperature. In particular, the back-side cooling and/or heating unit may minimize a temperature difference between the center of the wafer W and the periphery of the wafer W, thereby preventing or substantially minimizing plasma diffusion from a high-temperature region to a low-temperature region due to the temperature difference. In order to control temperatures of the center and periphery of the wafer W, the back-side cooling and/or heating unit may be installed under the pedestal 120 to cool or heat a back side of the wafer W. It is noted, however, that the back-side cooling and/or heating unit may not sufficiently control the temperature of an extreme edge of the wafer W.

In detail, a dry etching process may involve loading the wafer W with a material layer, e.g., a polysilicon (poly-Si) layer or an oxide layer, in the process chamber 110, injecting an etch gas into the process chamber 110, applying RF or microwave (MW) power to generate a plasma gas, and etching the material layer on the wafer W using the plasma gas. The dry etching process may not require a subsequent cleaning process but may allow the material layer to be anisotropically etched. Thus, as compared with a wet etching process, the dry etching process may be more appropriate for formation of fine patterns for highly integrated circuits and simplification of an etching process. However, when the temperature of the wafer W is raised to a predetermined temperature or higher or dropped to a predetermined temperature or lower during the dry etching process, an entire surface of the wafer W in a conventional plasma dry etching apparatus may not be uniformly etched, e.g., a temperature of the extreme edge of the wafer W may be different than other portions of the wafer W.

The entire surface of the wafer W may not be uniformly etched for various reasons. Among these, a surface temperature of the wafer W may be a largest parameter that prevents uniform etching of the entire surface of the wafer W. This is because the surface temperature of the wafer W may affect an etch rate that increases or decreases in proportion to the surface temperature of the wafer W. In particular, when the surface temperature of the wafer W is excessively raised or dropped, it is impossible to control an etching process, thus resulting in etching failures and yield loss.

In order to prevent the etching failures and yield loss, the surface temperature of the wafer W may be controlled using the back-side cooling or heating unit capable of supplying a cooling gas or hot gas to the back side of the wafer W during the dry etching process. For example, to control the surface temperature of the wafer W, the pedestal 120 on which the wafer W is loaded may include a plurality of holes through which a helium (He) gas flows to the back side of the wafer W. While an etching disparity between the center and periphery of the wafer W may be controlled using the back-side cooling and/or heating unit of the pedestal 120, as described above, the temperature of the extreme edge of the wafer W, i.e., about a 5 mm-wide outermost edge of the wafer W, may not be sufficiently controlled by the back-side cooling and/or heating unit.

For example, when the wafer W with the material layer is dry etched to form line-and-space (L&S) patterns, the uniformity of the critical dimension (CD) of bars may significantly affect formation of highly integrated circuits. However, the CD of the bars may increase or decrease according to the temperature of the extreme edge of the wafer W.

Figure 2:
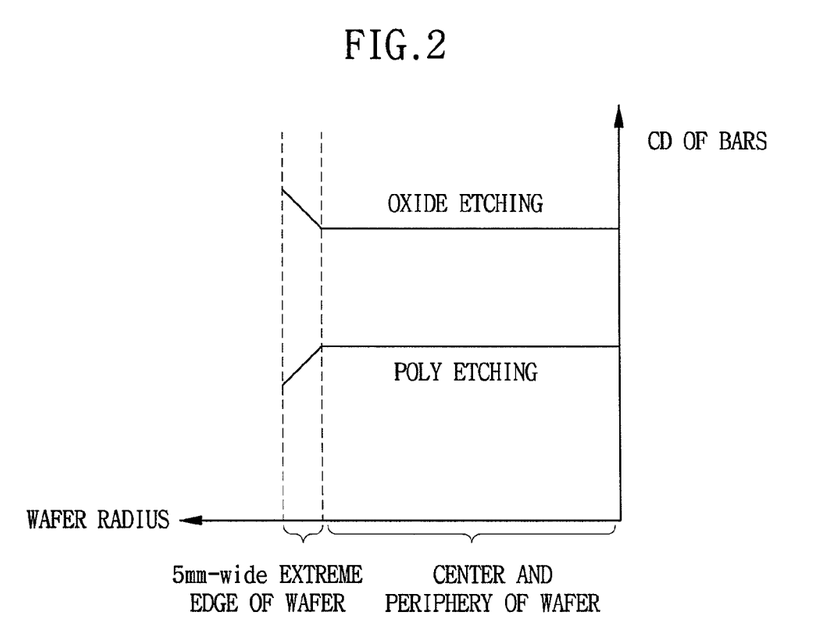
FIG. 2 illustrates a graph showing a reduction or increase in the critical linewidth of bars in an extreme edge of a wafer during a poly etching process and an oxide etching process.

For example, when the material layer on the wafer W is a poly-Si layer, the dry etching process may include a poly etching process using a radical etching technique to form L&S patterns. As such, an etched amount of the poly-Si layer may vary according to the density of a radical etchant, e.g., the poly-Si layer may be dry etched at a higher etch rate when the density of the radical etchant is increased, thereby resulting in a reduction in the critical dimension (CD) of bars. During the poly etching process, $Cl_2$, a fluorine (F) compound, or a bromine (Br) compound may be used as a process gas. Since the radical etchant is not consumed but remains intact on the edge ring 140 disposed outside the extreme edge of the wafer W, the radical etchant may be more abundant on the edge ring 140 than on the entire surface of the wafer W. When the density of the radical etchant increases, an etch rate may increase. Thus, when the density of the radical etchant on the edge ring 140 increases, the extreme edge of the wafer W disposed adjacent to the edge ring 140 may be etched at a higher etch rate, so that the CD of bars in the poly-Si layer may decrease as shown in FIG. 2.

In another example, when the material layer on the wafer W is an oxide layer, the dry etching may include an oxide etching using a polymeric etching process, i.e., so that an etched amount may be varied according to the density of a polymer, to form L&S patterns. During the oxide etching process, an oxide material may be etched due to a chemical reaction or impact ionization. When the density of the polymer increases, an etch rate may decrease. Thus, when the density of the polymer on the edge ring 140 increases, the extreme edge of the wafer W disposed adjacent to the edge ring 140 may be etched at a lower etch rate, so that the CD of the bars in the oxide layer may increase as shown in FIG. 2.

In yet another example, when a via contact is formed to connect interlayer interconnection lines in a semiconductor device, there are frequent cases where contacts are not open due to an abundant amount of polymer during an oxide etching process. The formation of not-open contacts may occur due to the same cause as when the oxide layer is dry etched to form the L&S patterns.

Figure 4:
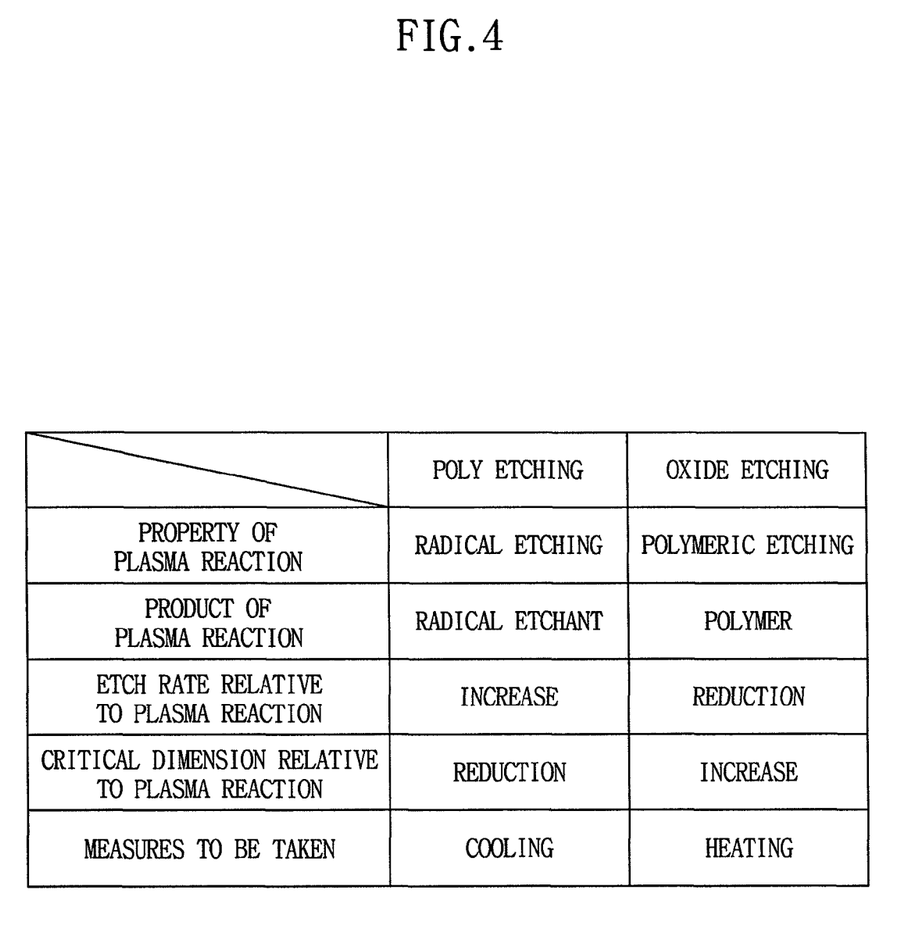
FIG. 4 illustrates a table of differences in a plasma reaction between a poly etching process and an oxide etching process.

As described above, and as summarized in FIG. 4, the poly etching process may lead to a reduction in the CD of bars, while the oxide etching process may lead to an increase in the CD of bars or formation of "not-open" contacts. Accordingly, it may be difficult to actively control an etching process only by back-side cooling and/or heating unit. Furthermore, it may be difficult to control the etching process using the back-side cooling and/or heating unit for controlling the temperature of the extreme edge of the wafer W. Thus, according to example embodiments, the dry etching apparatus may include an edge cooling and/or heating unit, so as to selectively perform a cooling process or a heating process of the extreme edge of the wafer W according to an etch gas.

Figure 3:
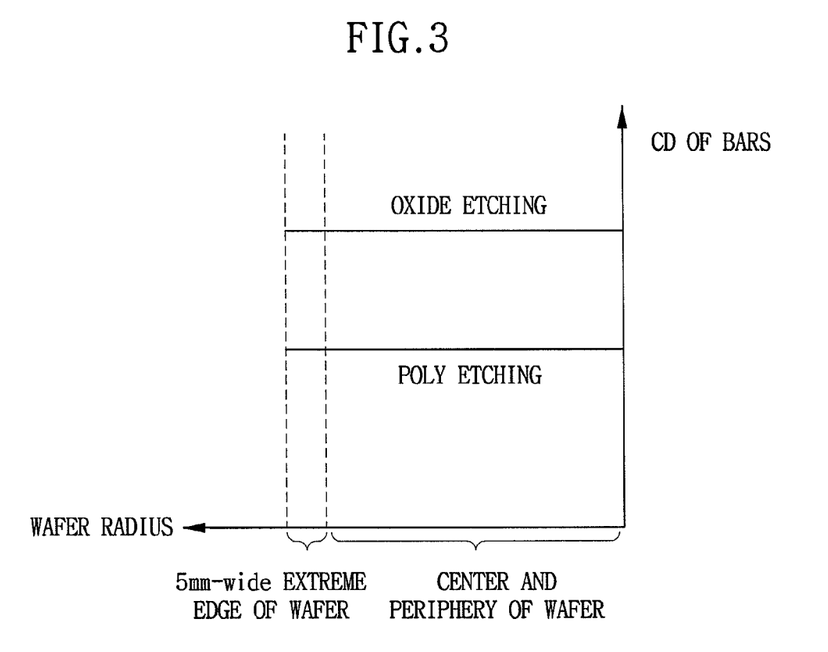
FIG. 3 illustrates a graph showing uniform critical dimension (CD) of bars by cooling or heating the temperature of an extreme edge of a wafer during a poly etching process and an oxide etching process according to example embodiments.

In detail, the poly etching process for dry etching the poly-Si layer to form the L&S patterns may need a cooling unit configured to drop the temperature of the edge ring 140 disposed adjacent to the wafer W in order to reduce the etch rate of the extreme edge of the wafer W. Similarly, the oxide etching process for dry etching the oxide layer to form the L&S patterns may need a heating unit configured to raise the temperature of the edge ring 140 in order to increase the etch rate of the extreme edge of the wafer W. Thus, as shown in FIG. 3, the CD of the bars may be substantially uniform in both the poly-Si layer and the oxide layer when the edge cooling and/or heating unit is used according to example embodiments.

It is noted that although performing an etching process in the process chamber 110 is mainly described herein, the above-described example embodiments may be applied likewise to a deposition process. For example, when the surface temperature of the wafer W is increased, a time taken for activated particles (e.g., neutralized particles such as radicals or ions) to stay on the wafer W may be reduced, the density of the activated particles may be lowered, and an etch rate per unit time may be reduced. In this case, in order to control the etch rate per unit time, a cooling unit may be required to drop the surface temperature of the wafer W.

Figure 5:
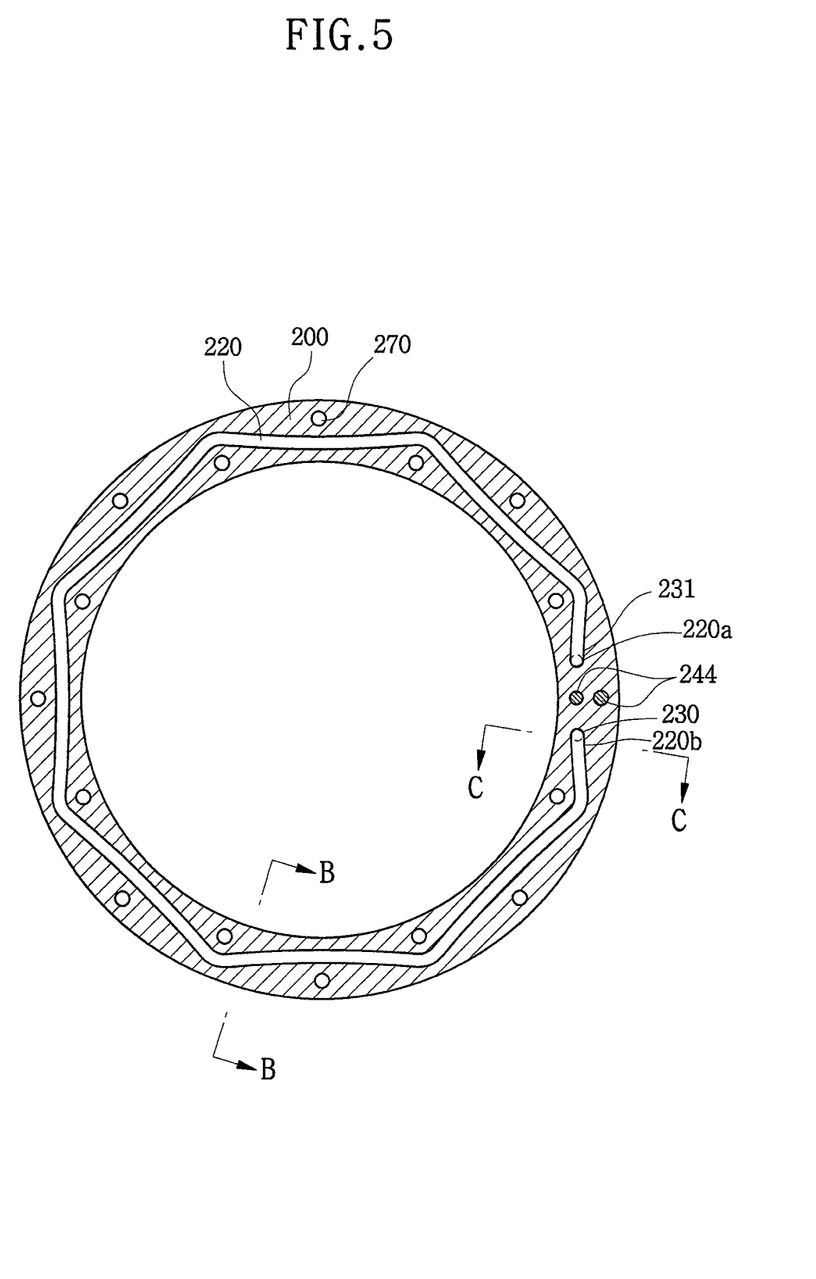
FIG. 5 illustrates a plan view of a coupling ring along line I-I of FIG. 1.
Figure 6:
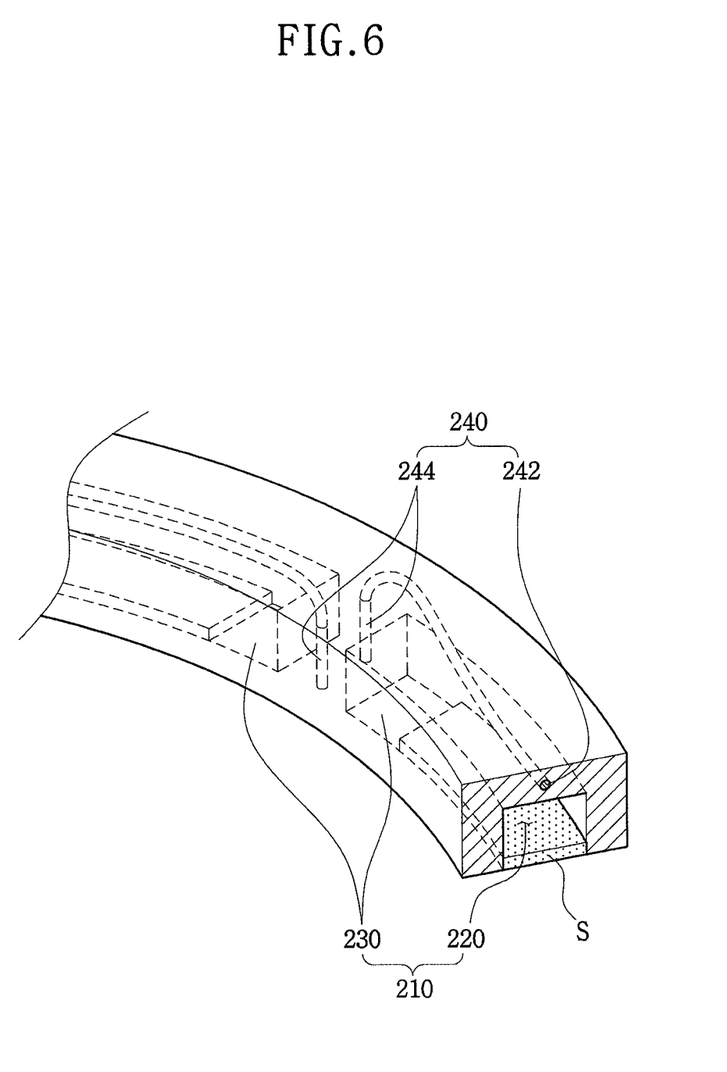
FIG. 6 illustrates a partial cut-away perspective view of a coupling ring including cooling and heating units according to example embodiments.
Figure 8:
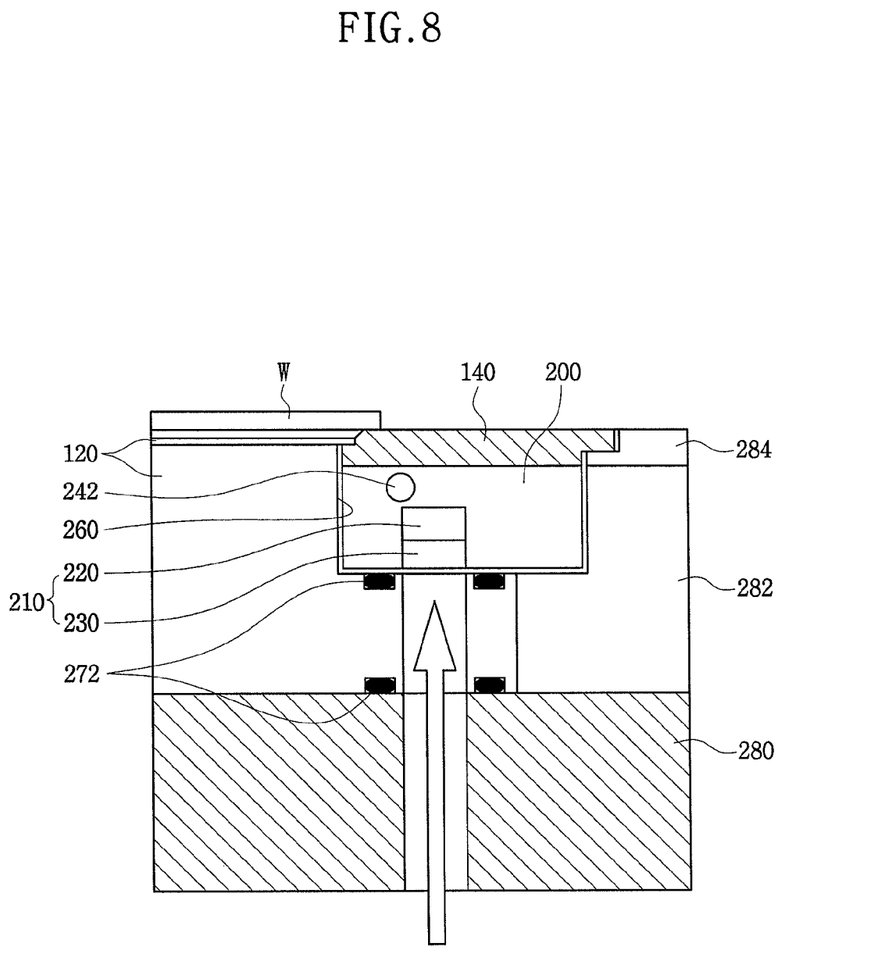
FIG. 8 illustrates a cross-sectional view taken along line C-C of FIG. 5, in which the portion P of FIG. 1 is enlarged.

The edge cooling and heating units in the coupling ring 200 according to example embodiments will be described in more detail below with reference to FIGS. 5-8. FIG. 5 illustrates a plan view of the coupling ring 200 along line I-I of FIG. 1, FIG. 6 illustrates a partial cut-away perspective view of the coupling ring 200 including the edge cooling and heating units, FIG. 7 illustrates a cross-sectional view along line B-B of FIG. 5, and FIG. 8 illustrates a cross-sectional view along line C-C of FIG. 5.

Referring to FIGS. 1 and 5-8, the coupling ring 200 with an edge cooling unit 210 and/or an edge heating unit 240 may be provided under the edge ring 140 in order to control the temperature of the extreme edge of the wafer W. In accordance with the example embodiment shown in FIG. 7, an upper surface of the edge ring 140 is in direct contact with a lower surface of an extreme edge of the wafer W. The coupling ring 200 may include a first surface 200a on the edge ring 140, and at least a second surface 200b on the pedestal 120, e.g., the first and second surfaces 200a and 200b may be perpendicular to each other. For example, the coupling ring 200 may be within the pedestal 120, so the edge ring 140 may be on, e.g., directly on, the coupling ring 200, e.g., via an adhesive pad 275. For example, the coupling ring 200 may extend along a perimeter of the pedestal 120, and the edge ring 140 may overlap, e.g., completely overlap, the first surface 200a of the coupling ring 200. The coupling ring 200 may function to transmit heat and include the edge cooling unit 210 and the edge heating unit 240, which may raise or drop the temperature of the coupling ring 200 to cool or heat the edge ring 140. The coupling ring 200 may be formed of a highly thermal conductive material with a uniform thermal distribution, e.g., a metal, such as aluminum (Al), or similarly conductive materials. It is noted that although the present example embodiments describe that the coupling ring 200 having a ring structure is provided under the edge ring 140, the edge cooling unit 210 and the edge heating unit 240 may be directly installed at the edge ring 140 without using the coupling ring 200.

The edge ring 140 may be formed of, e.g., quartz, silicon, or a ceramic material. For example, in a poly etching process, a quartz edge ring may be used, while in an oxide etching process, a silicon edge ring 140 may used. That is, a silicon edge ring 140 used in the oxide etching process may be replaced with a quartz edge ring 140 in the poly etching process. In another example, the edge ring 140 may be formed of a ceramic material, e.g., alumina, so that both the oxide etching process and the poly etching process may be performed with the same edge ring and the temperature of the extreme edge of the wafer W may be easily controlled.

As further illustrated in FIG. 7, a thermal insulating layer 260 may be disposed between the pedestal 120 and the coupling ring 200 to minimize the range of temperature variation and to actively control the temperature. In particular, as described previously, the pedestal 120 may include the back-side cooling/heating units 300 in order to eliminate a temperature difference between the center and periphery of the wafer W. According to the present example embodiments, it is particularly important to cut off heat transmission between the pedestal 120 and the coupling ring 200, so that the pedestal 120 and the coupling ring 200 may control the temperature of the wafer W independently. The thermal insulating layer 260 may be formed of a thermal insulating material, e.g., a ceramic material or an engineering plastic material. Examples of a ceramic material may include alumina or quartz, and examples of an engineering plastic material may include polyimide, Teflon, or Peek. The thermal insulating layer 260 may be formed to a thickness of about 0.1 mm to about 10 mm to obtain a satisfactory thermal insulation effect.

As further illustrated in FIGS. 5-8, the coupling ring 200 may include the edge cooling unit 210 and/or the edge heating unit 240. As the process gas used for the poly etching process may differ from the process gas used for the oxide etching process, the edge ring 140 may require cooling or heating according to each process. Thus, the coupling ring 200 may include both the edge cooling unit 210 and the edge heating unit 240 to actively control the surface temperature of the extreme edge of the wafer W during each of the poly etching process and the oxide etching process.

As illustrated in FIGS. 5-6, the cooling unit 210 may include a coolant channel 220 and a coolant C. The coolant channel 220 may be formed in a ring structure of the coupling ring 200 according to the type of the ring structure of the coupling ring 200. The coolant C may flow through the coolant channel 220. The coolant C may be cooling water or any other coolant.

Figure 9:
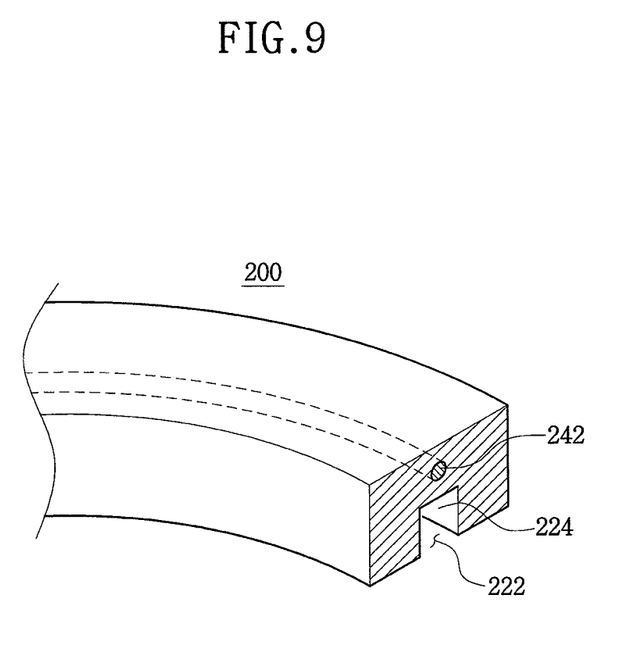
FIG. 9 illustrates a partial cut-away perspective view of a process of casting a coupling ring into which a heater coil is inserted.
Figure 10:
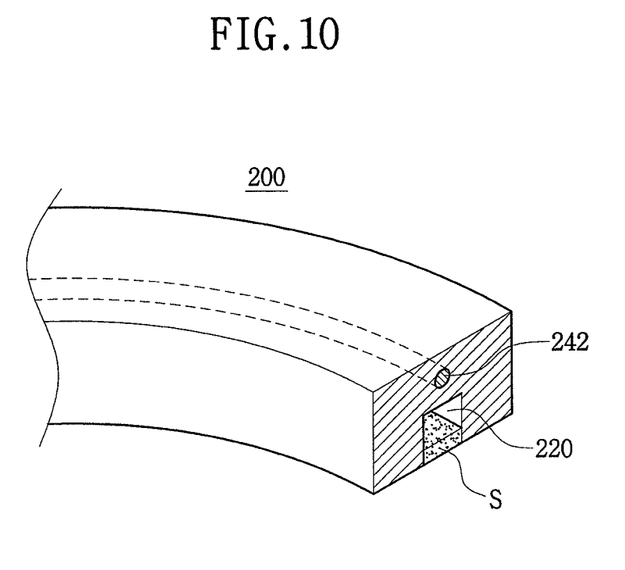
FIG. 10 illustrates a partial cut-away perspective view of a process of soldering or welding a groove of the coupling ring to complete a coolant channel.

The coolant channel 220 may have an annular structure to allow the coolant C to circulate through the coupling ring 200 with the ring structure. In this case, the coupling ring 200 may be easily manufactured using a casting technique. Referring to FIG. 9, in order to form the coolant channel 220, an annular groove 224 having an opening 222 may be formed in a bottom surface of the coupling ring 200. Referring to FIG. 10, the opening 222 may be brazed or welded by electronic beams (e-beams) along the groove 224, so that the groove 224 may be closed up to form the coolant channel 220. Thus, the coolant channel 220 of the coupling ring 200 may be filled with a lower spacer S using a brazing or e-beam welding technique, thereby forming a brazing unit or welding unit. A brazing or welding material may be the same as or similar to a material of the coupling ring 200.

The coolant channel 220 may be a single-turn or a multi-turn coolant channel capable of rotating once or more according to the ring structure of the coupling ring 200, e.g., the coolant channel 220 may include at least two linear segments with an angle other than 180° therebetween. For example, as illustrated in FIG. 5, the coolant channel 220 may have at least seven linear segments angled with respect to each other and connected in series within the coupling ring 200 to surround the coupling ring 200. The coolant channel 220 may be formed to a height of about 2 mm to about 20 mm and a width of about 2 mm to about 20 mm, so that the coolant C may flow smoothly.

As illustrated in FIG. 8, the cooling unit 210 may include at least one vertical channel connected to the coolant channel 220 for supplying and discharging the coolant C from the coolant channel 220. For example, a supply channel 231 and a discharge channel 230 for supplying and discharging the coolant C, may be respectively formed on both sides of the annular coolant channel 220 from which the coolant C starts to flow, and may extend in a vertical direction, i.e., perpendicularly, to the coolant channel 220. That is, as illustrated in FIG. 5, the supply channel 231 may extend vertically, e.g., in a downward direction, from a first edge 220a of the coolant channel 220 to supply the coolant C into the coolant channel 220, while the discharge channel 230 may extend vertically, e.g., in a downward direction, from a second edge 220b of the coolant channel 220 to remove the coolant C from the coolant channel 220. It is noted that the first and second edges 220a and 220b of the coolant channel 220 refer to opposite terminal edges of the coolant channel 220.

As illustrated in FIGS. 5-6, the heating unit 240 may include a heater with a heater coil 242 and a heater terminal 244. The heater coil 242 may be installed a predetermined distance apart from the cooling unit 210, e.g., a predetermined distance above the coolant channel 220, and may extend over and parallel to the coolant channel 220. The heater may be a resistive heater with a power of about 50 W to about 500 W. Thus, the heater coil 242 may be formed of a nickel-chrome (Ni—Cr)-based material having a small resistance variation and a relatively long lifespan. The heater coil 242 may be any one of a single-turn coil and a multi-turn coil.

The heater terminal 244 may be provided in a space between the supply and discharge channels 231 and 230, i.e., in a portion of the coupling ring 200 where the coolant channel 220 is not provided. Thus, the supply channel 230 and the heater terminal 244 may vertically extend from a lower portion of the coupling ring 200 toward an upper portion thereof within such a range as to prevent the supply channel 230 and the heater terminal 244 from overlapping each other, i.e., the supply channel 230 and the heater terminal 244 may be separated from each other to avoid interference. The coolant channel 220 and the heater coil 242 may be turned to horizontally circulate within the annular coupling ring 200, and the discharge channel 230 and the heater terminal 244 may vertically extend from the upper portion of the coupling ring 200 toward the lower portion thereof.

Typically, heaters may be classified into cast-in heaters or tight-fitting heaters depending on a manufacturing method. In particular, a cast-in heater may be highly appropriate for the heater because the cast-in heater is cast with the heater coil 242 inserted thereto, so that the heater coil 242 may be disposed in a desired shape within the coupling ring 242.

As described previously, the edge ring 140 and the coupling ring 200 may be bonded to each other by the adhesive pad 275, e.g., an epoxy polymer bonder or a silicon polymer bonder. The adhesive pad 275 may have a thickness of about 0.05 mm to about 5 mm.

The pedestal 120 and the coupling ring 200 may be fixed using various coupling units. However, in order to seal off the coolant C, which is a fluid, the pedestal 120 may be closely combined with the coupling ring 200 using a bolt 270. Accordingly, as illustrated in FIG. 5, the coolant channel 220 may be turned along an outer circumference of the coupling ring 200 not in a circular form but in a zigzag curve form, i.e., between the bolts 270, to stably mount the bolt 270.

Although the coolant channel 220 is maintained under an atmospheric pressure, a vacuum space may be disposed above the pedestal 120 so that the coolant C may flow out to the vacuum space. In order to seal off the coolant C more effectively, an O-ring 272 for sealing off the coolant C from the vacuum space may be installed on edges of the supply and discharge channels 230, as illustrated in FIG. 8. The bolt 270 may apply pressure to the O-ring 272, so that the O-ring 272 may be more closely adhered to the coupling ring 200 and the pedestal 120 between the coupling ring 200 and the pedestal 120.

As further illustrated in FIGS. 1 and 7-8, an insulator plate 280 may be further installed under the pedestal 120, i.e., between a bottom of the pedestal 120 and a bottom of the processing chamber 110, and an insulator ring 282 may be disposed along an outer circumference of the pedestal 120. For example, the coupling ring 200 may be enclosed by the pedestal 120, the edge ring 140, and the insulator ring 282. The supply and discharge channels 230 for supplying the coolant C may extend to the insulator plate 280 or the insulator ring 282. Here, the O-ring 272 may be interposed between the pedestal 120 and the insulator plate 280 (or insulator ring 282).

When the insulator ring 282 is further provided, a cover ring 284 may be further disposed on the insulator ring 282. Like the edge ring 140, the cover ring 284 may be formed of silicon (Si), quartz, or a ceramic material according to the type of a process gas.

Meanwhile, a direct-current (DC) current may be used to drive the heater, and RF power may be used as bias power or source power to induce plasma discharge, so that the heater may not be disturbed by the RF power. Accordingly, the heater terminal 244 may further include a filter (not shown) in order to prevent the RF power from leaking from bias or source RF power to the heater.

As explained thus far, present example embodiments provide a plasma dry etching apparatus capable of actively raising or dropping the temperature of the extreme edge of the wafer W irrespective of the kinds of a material layer to be etched and an etch gas used. That is, example embodiments relate to a plasma dry etching apparatus including not only back-side cooling and heating units but also edge cooling and heating units. The back-side cooling and heating units may be provided on a pedestal including an electrostatic chuck (ESC) capable of directly supporting a wafer in order to control etch rates of the center and periphery of the wafer. Also, the edge cooling and heating units may be further provided in a coupling ring independently of the pedestal to selectively control an etching temperature within the same process chamber irrespective of the kinds of material and etch gas used. In this case, a thermal insulation layer may be further provided between the pedestal and the coupling ring to independently control the coupling ring. As described above, the plasma dry etching apparatus according to example embodiments may have the following effects.

First, in addition to cooling and heating units capable of directly cooling or heating the back side of a wafer, cooling and heating units capable of indirectly cooling or heating an edge of the wafer may be further installed on an edge ring. Therefore, the CD of an extreme edge of the wafer may be maintained constant, and a contact hole may be opened. Also, even the 5 mm-wide extreme edge of the wafer may be used as a product as it is, i.e., as opposed to discarding the 5 mm wide extreme edge region of the wafer W due to non-uniform CD of bars or "not-open" contact failures, thereby increasing an economical effect.

Second, in view of the fact that the surface temperature of the wafer is an important parameter that affects plasma etching characteristics, a cooling unit may be selected during a poly etching process, and a heating unit may be selected during an oxide etching process. Accordingly, the plasma dry etching apparatus according to the example embodiments may appropriately cope with the types of a material layer to be etched and an etch gas used.

Third, a thermal insulation layer may be disposed between a pedestal capable of directly sustaining the wafer and an edge ring spaced a predetermined distance apart from the wafer. Therefore, the temperature of the extreme edge of the wafer may be controlled independently of conventional back-side cooling and heating units.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma dry etching apparatus, comprising:
a process chamber;
a pedestal in the process chamber, the pedestal being configured to support a wafer;
a cathode electrode and a plate electrode in the process chamber, the cathode and plate electrodes being configured to apply radio-frequency (RF) power;
an edge ring that is on an edge of the pedestal and that is substantially coplanar with an uppermost side of the pedestal;
a coupling ring having a first side in a recess within the pedestal and a second side under the edge ring;
a temperature adjuster configured to adjust a temperature of a first region of the wafer;
an edge cooling unit in the coupling ring, the edge cooling unit being configured to cool the edge ring and a second region including an extreme edge of the wafer;
an edge heating unit in the coupling ring, the edge heating unit being configured to heat the edge ring and the second region including the extreme edge of the wafer, wherein the edge cooling unit and the edge heating unit of the coupling ring are controlled independently from the temperature adjuster to adjust a temperature of the second region of the wafer, and wherein the first region is disposed inside the second region.

2. The plasma dry etching apparatus as claimed in claim 1, wherein:
the coupling ring and the edge ring fill the recess in the pedestal, and
the edge ring and the coupling ring are discrete elements that include different materials, each of the edge ring and coupling ring being positioned to overlap the extreme edge of the wafer, at least a portion of the edge ring configured to support the extreme edge of the wafer from thereunder.

3. The plasma dry etching apparatus as claimed in claim 1, wherein the edge ring includes a ceramic material.

4. The plasma dry etching apparatus as claimed in claim 1, wherein the coupling ring includes a thermal conductive metal, and the edge heating unit is configured to be driven by a direct current that is independent from the radio-frequency (RF) power the cathode and plate electrodes are configured to apply.

5. The plasma dry etching apparatus as claimed in claim 1, wherein the temperature adjuster includes at least one of a back-side cooling unit and or a back-side heating unit configured to control the temperatures of a center region and a periphery region of the wafer.

6. The plasma dry etching apparatus as claimed in claim 5, further comprising a thermal insulation layer between the pedestal and the coupling ring, the thermal insulation layer further insulating the center region from the periphery region to allow the edge cooling and heating units being configured to control the temperature of the periphery region of the wafer independently of the temperature of the back-side cooling and heating units.

7. The plasma dry etching apparatus as claimed in claim 6, wherein the thermal insulation layer includes $Al_2O_3$, ceramic, quartz, or an engineering plastic to a thickness of about 0.1 mm to about 10 mm.

8. The plasma dry etching apparatus as claimed in claim 1, wherein the edge cooling unit includes:
a coolant channel within the coupling ring, the coolant channel being configured to bend at least once;
a coolant configured to flow through the coolant channel;
a supply channel extending vertically from a first edge of the coolant channel and configured to supply coolant to the coolant channel; and
a discharge channel extending vertically from a second edge of the coolant channel and configured to discharge coolant from the coolant channel.

9. The plasma dry etching apparatus as claimed in claim 8, wherein the coupling ring includes aluminum (Al).

10. The plasma dry etching apparatus as claimed in claim 9, wherein the coolant channel has an annular structure with a height of about 2 mm to about 20 mm and a width of about 2 mm to about 20 mm.

11. The plasma dry etching apparatus as claimed in claim 8, further comprising an epoxy polymer pad or a silicon polymer pad coupling the edge ring and coupling ring, the pad having a thickness of about 0.05 mm to about 5 mm.

12. The plasma dry etching apparatus as claimed in claim 8, further comprising bolts extending through the coupling ring to couple the pedestal and the coupling ring to each other, the coolant channel extending within the coupling ring in a zig-zag curve between the bolts.

13. The plasma dry etching apparatus as claimed in claim 8, further comprising an O-ring configured to seal off the coolant from a vacuum space, the O-ring being disposed on edges of the supply and discharge channels between the coupling ring and the pedestal by a bolt.

14. The plasma dry etching apparatus as claimed in claim 8, further comprising:
   an insulator plate disposed under the pedestal;
   an insulator ring disposed along an outer circumference of the pedestal; and
   a cover ring disposed on the insulator ring, the supply and discharge channels extending toward the insulator plate or the insulator ring, and an O-ring being positioned between the pedestal and the insulator plate or between the pedestal and the insulator ring.

15. The plasma dry etching apparatus as claimed in claim 8, wherein the edge heating unit includes a heater coil and a heater terminal.

16. The plasma dry etching apparatus as claimed in claim 15, wherein the heater coil is disposed a predetermined distance apart from the coolant channel over and parallel to the coolant channel and turned at least once.

17. The plasma dry etching apparatus as claimed in claim 15, wherein the heater terminal is disposed inside the coupling ring and outside the coolant channel, the heater terminal extending vertically to the heater coil and separately from the supply and discharge channels.

18. The plasma dry etching apparatus as claimed in claim 15, wherein the heater coil is a resistive heater with a power of about 50 W to about 500 W, and the heater is a cast-in heater that includes a heater coil integral with the coupling ring.

19. A plasma dry etching apparatus, comprising:
   a process chamber;
   a electrode in an upper portion of the process chamber;
   a pedestal configured to support a wafer in process chamber, the pedestal being under the electrode;
   a edge ring supporting side surfaces of the pedestal, an upper surface of the edge ring being in direct contact with a lower surface of an extreme edge of the wafer;
   a temperature element configured to control a temperature of the entire wafer;
   a coupling ring attached under the edge ring, the coupling ring overlapping a second region including the extreme edge of the wafer, the coupling ring including an edge cooling unit and an edge heating unit; and
   a thermal insulating layer configured to reduce cut off heat transmission between the pedestal and the coupling ring, the thermal insulating layer being between the pedestal and the coupling ring, wherein the edge cooling unit and the edge heating unit of the coupling ring are controlled independently from the temperature adjuster to adjust a temperature of the extreme edge of the wafer.

* * * * *